United States Patent [19]
Fukuda

[11] Patent Number: 5,889,709
[45] Date of Patent: Mar. 30, 1999

[54] DATA LATCH CIRCUIT DEVICE WITH FLIP-FLOP OF SEMI-CONDUCTOR MEMORY OF SYNCHRONOUS DRAM

[75] Inventor: Takeshi Fukuda, Kanagawa, Japan

[73] Assignee: NEC Corporation, Tokyo, Japan

[21] Appl. No.: 25,999

[22] Filed: Feb. 19, 1998

[30] Foreign Application Priority Data

Feb. 27, 1997 [JP] Japan .................................... 9-044126

[51] Int. Cl.$^6$ .................................................. G11C 16/04
[52] U.S. Cl. ...................... 365/189.05; 365/233; 327/143
[58] Field of Search ............................... 365/189.05, 233; 327/143

[56] References Cited

U.S. PATENT DOCUMENTS 5,559,458  9/1996  Holler, Jr. ................................ 327/143
5,801,561  9/1998  Wong et al. ............................. 327/143

Primary Examiner—David Nelms
Assistant Examiner—Van Thu Nguyen
Attorney, Agent, or Firm—Young & Thompson

[57] ABSTRACT

A data latch circuit device consists of synchronous dynamic random access memory, in which it causes number of elements and bus line wiring to reduce to be prevented floating state of DFF circuit in stand-by state at the time putting power supply to work. In the data latch circuit device, there is provided transfer gates for switching so as to supply pulse signal PC to clock signal CK instead of clock signal CLK within active period of the reset signal in answer to provision of the reset signal RP.

6 Claims, 8 Drawing Sheets

F I G. 6
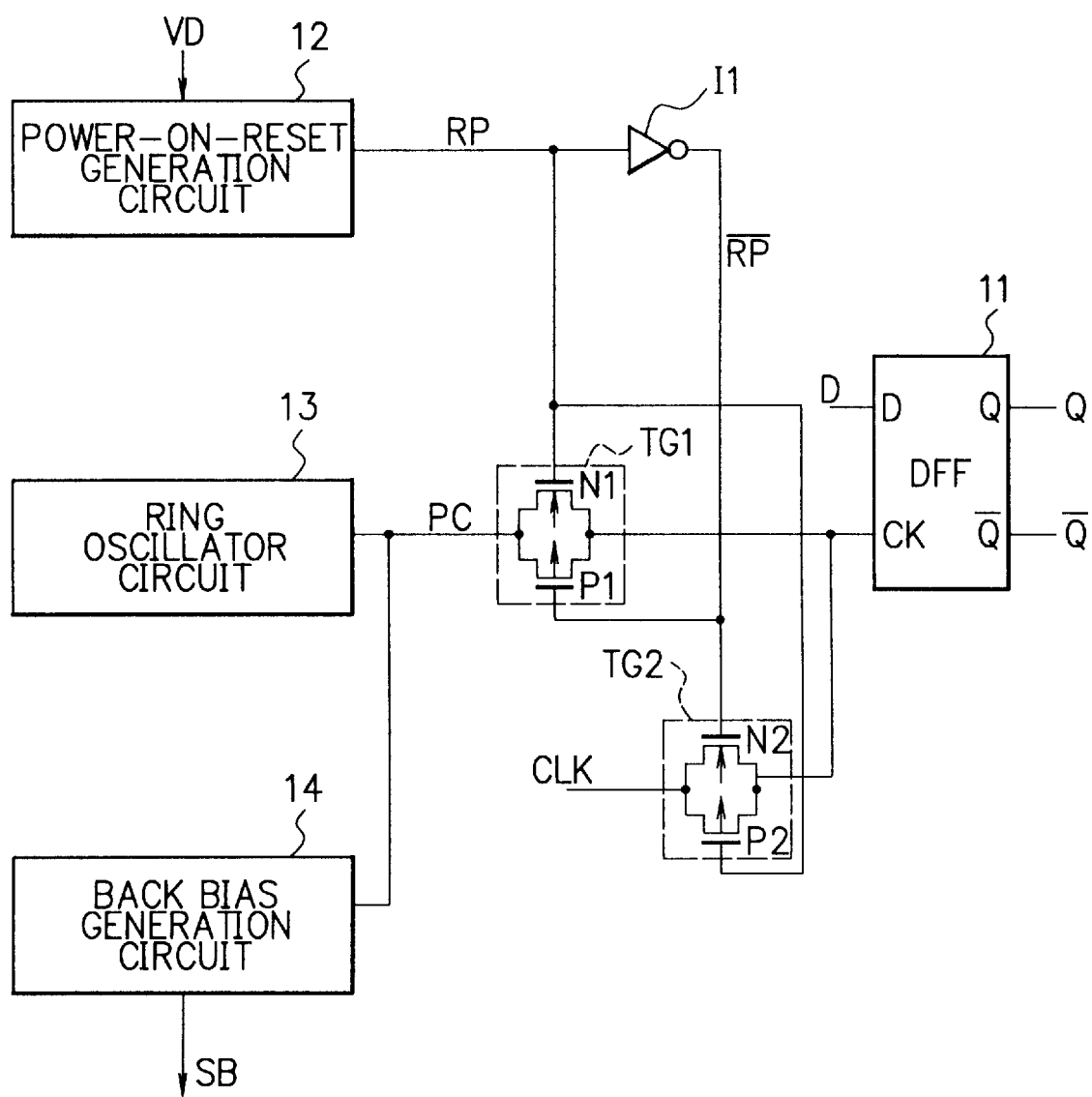

F I G. 7
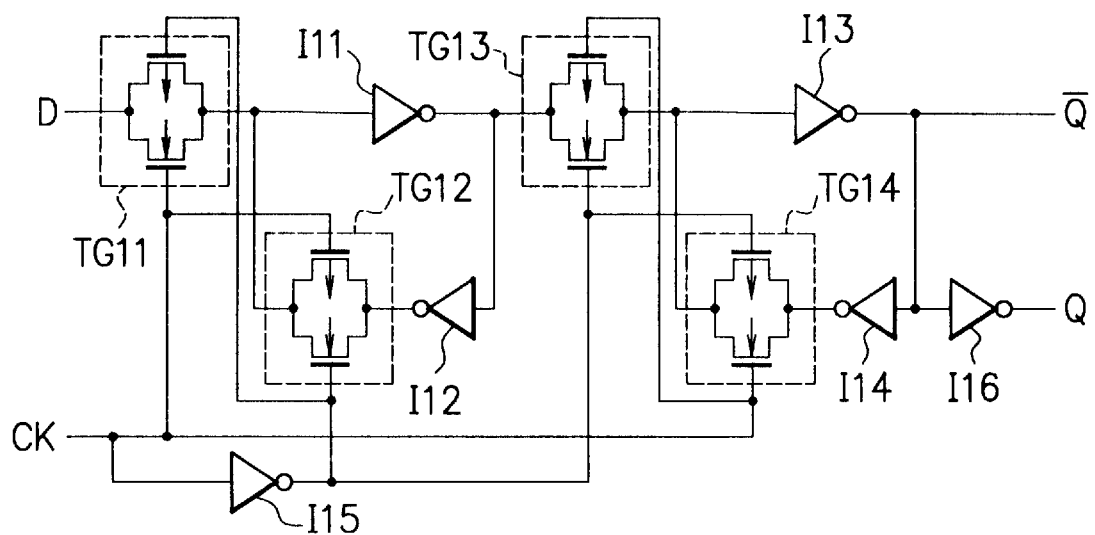

DATA LATCH CIRCUIT DEVICE WITH FLIP-FLOP OF SEMI-CONDUCTOR MEMORY OF SYNCHRONOUS DRAM

BACKGROUND OF THE INVENTION

The present invention relates to a data latch circuit device. More to particularly this invention relates to a data latch circuit device in which a flip-flop of semi-conductor memory of synchronous dynamic random access memory (DRAM) type such as field memory and so forth has been in use for preventing floating state of D-flip-flop circuit in stand by state at the time applying power source.

DESCRIPTION OF THE PRIOR ART

In general, a synchronous DRAM transfers data while synchronizing data signal with clock signal. A data latch circuit device in which master/slave type D-flip-flop circuit (hereinafter referring to DFF circuit) is in use is provided for such a synchronous DRAM.

In the early synchronous DRAM, although it causes an input-pin of device to be stand-by state after putting the power supply to work, feedthrough current flows because floating state of gate at DFF circuit is generated. For this reason, when it causes a current value of early state to measure, dispersion of the current occurs regardless of any measuring method in which it does not cause above floating state to remove by applying some pulses of clock signals. Thereby, when it causes a current value of the device to be measured, it is incapable of measuring the current value of the device accurately unless the measuring device is provided therewith a pulse generator which is capable of supplying above clock signal. Furthermore, when the above-stated floating state occurs, an output state is undefined and unstable, consequently, a normal circuit operation is incapable of being performed.

In the conventional data latch circuit device, the data latch circuit device with reset function is in use as DFF circuit. Further, the data latch circuit device provides therewith power-ON-reset generating circuit. The data latch circuit device causes reset signal of one shot pulse to generate at the same time rising of power supply, so that it causes respective gates of DFF circuit to be fixed electric potential by the reset signal, thus eliminating the floating state.

FIG. 1 is a block diagram showing a general conventional data latch circuit device in which the DFF circuit with such a floating prevention function is in use. The data latch circuit device comprises a DFF 101 having reset input R for data latching with reset function, and a power-ON-reset generating circuit 12 for generating reset signal RP of one shot pulse at a time putting power supply to work. Further, the data latch circuit device comprises a back bias generator (BBG) 14 for generating substrate electric potential SB to set electric potential of a substrate as a relevance circuit, and a ring oscillator circuit 13 for generating driving pulse PC of BBG 14.

FIG. 2 is a circuit diagram showing constitution of DFF 101, in referring to FIG. 2, the first DFF 101 comprises a NOR circuit O11, an inverter I12, and clock CK constituting a master FF to latch data, which DFF 101 comprises transfer gates TG11, and TG12 controlled by CKB, which DFF 101 comprises an inverter I15 for generating an inversion clock signal CK bar (B) while inverting clock signal CK, and which DFF 101 comprises an inverter I16 for outputting an inversion data output QB while inverting the data output Q.

The DFF 101 uses one side of respective inverters for data latching of the master FF and slave FF as NOR circuits O11, O12, so that it causes respective one side inputs to be reset input R of these NOR circuits O11, O12.

FIG. 3 is a circuit diagram showing a second DFF circuit 101A with reset function described in the Japanese Patent Application Laid-Open No. HEI 5-327422 (reference material 1). In FIG. 3, common reference character/numeral is attached to the common structural element of FIG. 2. In FIG. 3, the DFF 101A differs from the DFF 101 in that the DFF 101A comprises inverters I11, and I13 instead of the NOR circuits O11, and O12, which DFF 101A comprises N-channel transistors N11, and N12 for connecting each input of inverters I11, and I13, namely for performing pull-down to earth electric potential (L level), while conducting in answer to supply of reset signal RP toward respective gates.

Next, operation of the conventional data latch circuit device is described referring to FIGS. 1, 2, 3, and FIG. 4 which is a time chart showing operation waveform. The power-ON-reset generation circuit 12 causes the electric potential of respective gates of whole DFF circuits to be either H-level or L-level, while applying the reset signal RP to the reset input R of either the DFF 101 or the DFF 101A.

Referring to FIG. 4, on the supposition that the power supply VD rises as shown in FIG. 4, one pulse of the power-ON-reset signal RP is generated along front edge of rise of the power supply VD as shown in FIG. 4, when the power supply VD rises more than Vt of the transistor for voltage detection of the power-ON-reset generation circuit 12. The clock CK is taken to be fixed electric potential at the time of stand-by. A data input D of the DFF 101/DFF 101A is taken to be fixed to L-level.

With the result that in the case of the DFF 101, respective NOR circuits O11, O12 receive provision of waveform of reset signal RP, before respective outputs come to be L-level, thus output Q of the DFF 101 is fixed to L-level as shown in FIG. 4.

FIG. 5 is a block diagram showing one example of constitution of field memory which is typical of synchronous DRAM. In FIG. 5, a field memory as a peripheral circuit of memory cell array 24 comprises a controller 31 with DFF (R-DFF) having reset function as principal structural elements, a write address counter 32, a read address counter 33, a refresh address counter 34, respective address pointers 26, 21 of read/write, respective buffers 23, 28 of input/output, and SRAM buffer 27.

These respective structural elements are in use for R-DFF circuits by numbers corresponding to bit number of address bus or data bus.

Here, there are problems that the conventional data latch circuit device requires bus line wiring for transferring power-ON-reset signal RP from the power-ON-reset generation circuit 12 to DFF of respective structural circuits. In the case of DFF 101, the conventional data latch circuit device requires NOR circuits O11, O12 with large number of elements as the inverter for data latch of both of the master FF and the slave FF for reset function. While in the case of DFF 101A, the conventional data latch circuit device requires N-channel transistors N11, N12 for L-level pull down. Elements and related wiring region increase.

For example, two pieces of R-DFF in every one bit of bus are in use for only input buffer 23, namely approximately 100 pieces are in use for whole field memory of about 2M. For this reason, transferring bus line of the reset signal RP is wired all around of chip. Influence thereof to chip size is represented as following increase of area at a rough estimate.

If difference between area of DFF circuit without reset function and area of DFF circuit is taken as 500 $\mu m^2$, increase of area of whole chip comes into 500×100 pieces= 50000 $\mu m^2$.

Bus line wiring of the power-ON-reset signal RP makes a round of chip and with chip size as 6 mm (6000 $\mu$m) cut chip square, and wiring width is taken to be 2.8 $\mu$m, due to this condition, enlarged area comes to be 24000×2.8 $\mu$m=67200 $\mu$m$^2$, As a result, it causes chip ares to increase totally 117200 $\mu$m$^2$.

In the above described conventional data latch circuit device, DFF with reset function having large number of elements as a DFF is in use for the conventional data latch circuit device, in order to prevent floating state of the DFF circuit in stand-by state at the time putting the power supply to work. There is required switching element causing input of inverter to implement pull-down/pull-up to either L-level or H-level in answer to provision of the power-ON-reset signal. There is required wiring for transferring power-ON-reset signal from the power-ON-reset generation circuit to DFF of respective structural circuits. Consequently, there is a defect that it causes chip area to increase considerably, because required number of elements and wiring region increase.

SUMMARY OF THE INVENTION

In view of the foregoing, it is an object of the present invention to provide a data latch circuit device which is capable of preventing floating state of the DFF circuit in stand-by state at the time to put power supply to work, while solving above defects and reducing number of elements and bus line wiring.

In accordance with one aspect of the present invention, for achieving the above-mentioned object, there is provided a data latch circuit device which comprises a power-ON-reset generating circuit for generating reset signal of one shot pulse at the time to put power supply to work, an oscillation circuit for outputting pulse shaped back bias driving signal for driving back bias generation circuit for generating substrate voltage, a D-flip-flop circuit for latching data signal while synchronizing data signal with clock signal and for outputting prior latch data, a synchronous dynamic random access memory for transferring the data signal while synchronizing the data signal with the clock signal, and a switch means for switching so as to supply the back bias driving signal to clock input end of the D-flip-flop circuit instead of clock signal within active period of the reset signal in answer to supply of the reset signal.

Preferably, there is provided a data latch circuit device wherein the switch means comprises a first transfer gate circuit for conducting the back bias driving signal in answer to a pair of complementary reset signals consisting of the reset signal and inversion reset signal which is of inverted signal of the reset signal, and a second transfer gate circuit for obstructing the clock signal in answer to the pair of complementary reset signals.

Preferably, there is provided a data latch circuit device wherein the switch means comprises an AND-NOR circuit for supplying NOT-OR to clock input end of said D-flip-flop circuit, which NOT-OR consists of a first AND of the reset signal and the back bias driving signal, and a second AND of the inversion reset signal which is of inverted signal of the reset signal and the clock signal.

The above and further objects and novel features of the invention will be more fully understood from the following detailed description when the same is read in connection with the accompanying drawings. It should be expressly understood, however, that the drawings are for purpose of illustration only and are not intended as a definition of the limits of the invention.

BRIEF DESCRIPTION OF THE DRAWINGS

FIG. 6 is a block diagram showing a first embodiment of a data latch circuit device according to the present invention;

FIG. 7 is a circuit diagram showing a constitution of the DFF of FIG. 6;

DETAILED DESCRIPTION OF THE PREFERRED EMBODIMENTS

A preferred embodiment of the present invention will be described in detail referring to the accompanying drawings.

Figure 1:
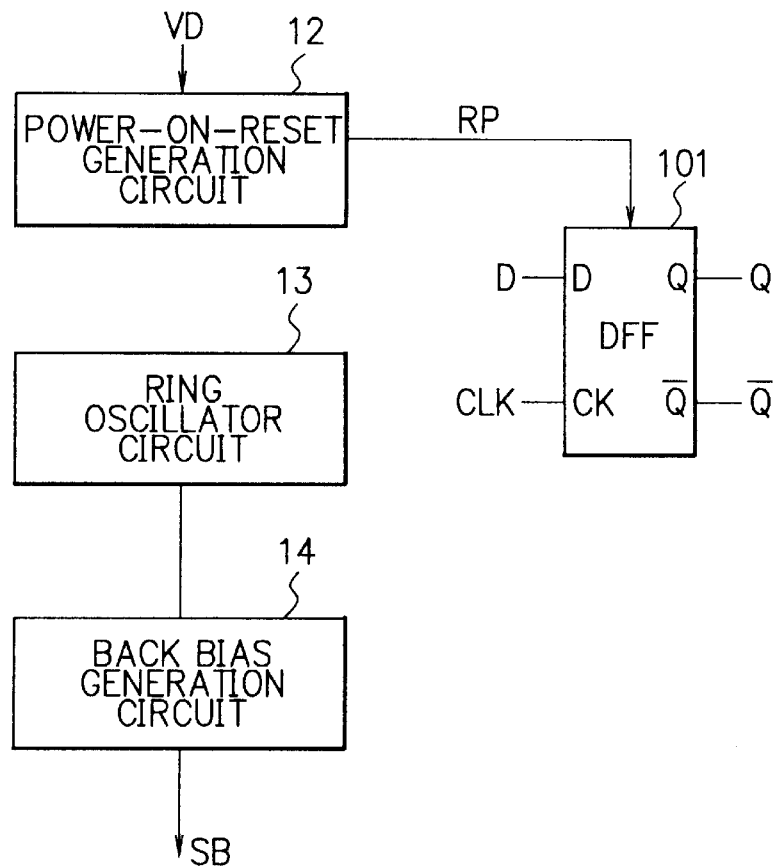
FIG. 1 is a block diagram showing one example of the conventional data latch circuit device.
Figure 2:
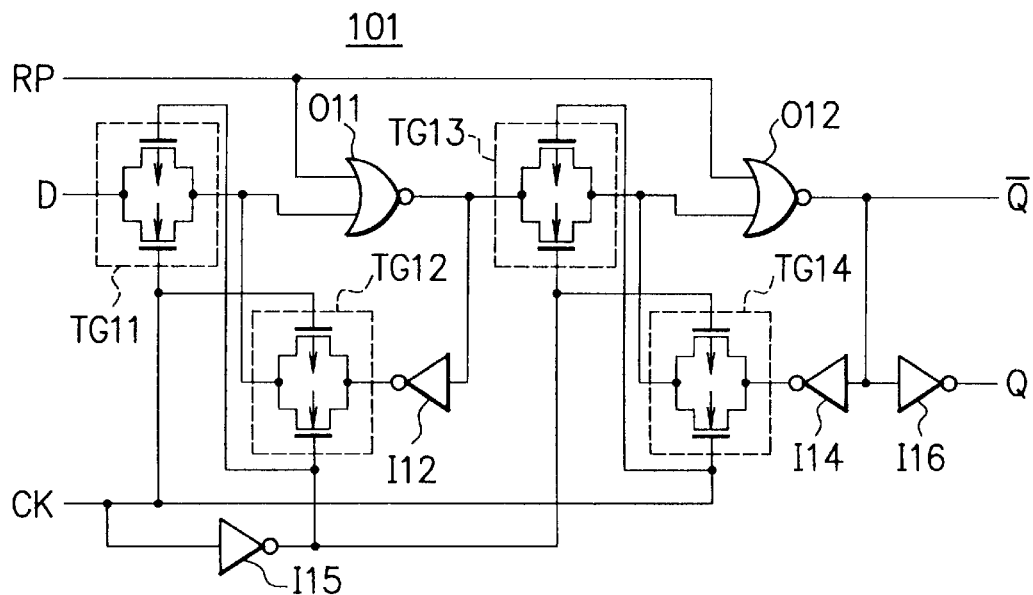
FIG. 2 is a circuit diagram showing a first constitution of the DFF with reset function of FIG. 1.
Figure 3:
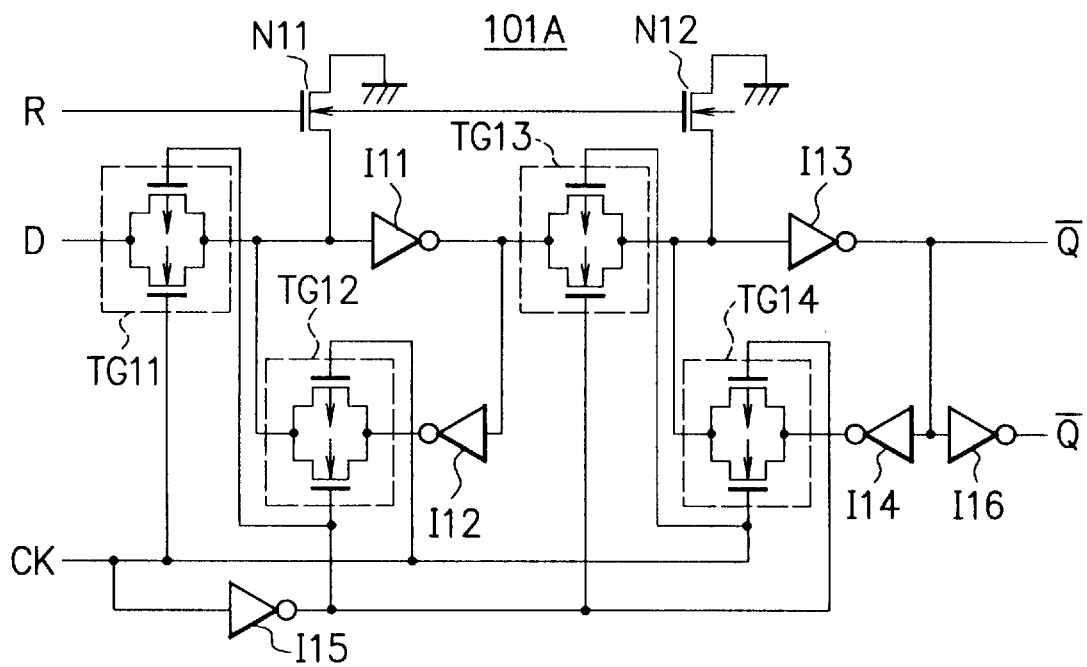
FIG. 3 is a circuit diagram showing a second constitution of the DFF with reset function of FIG. 1.
Figure 4:
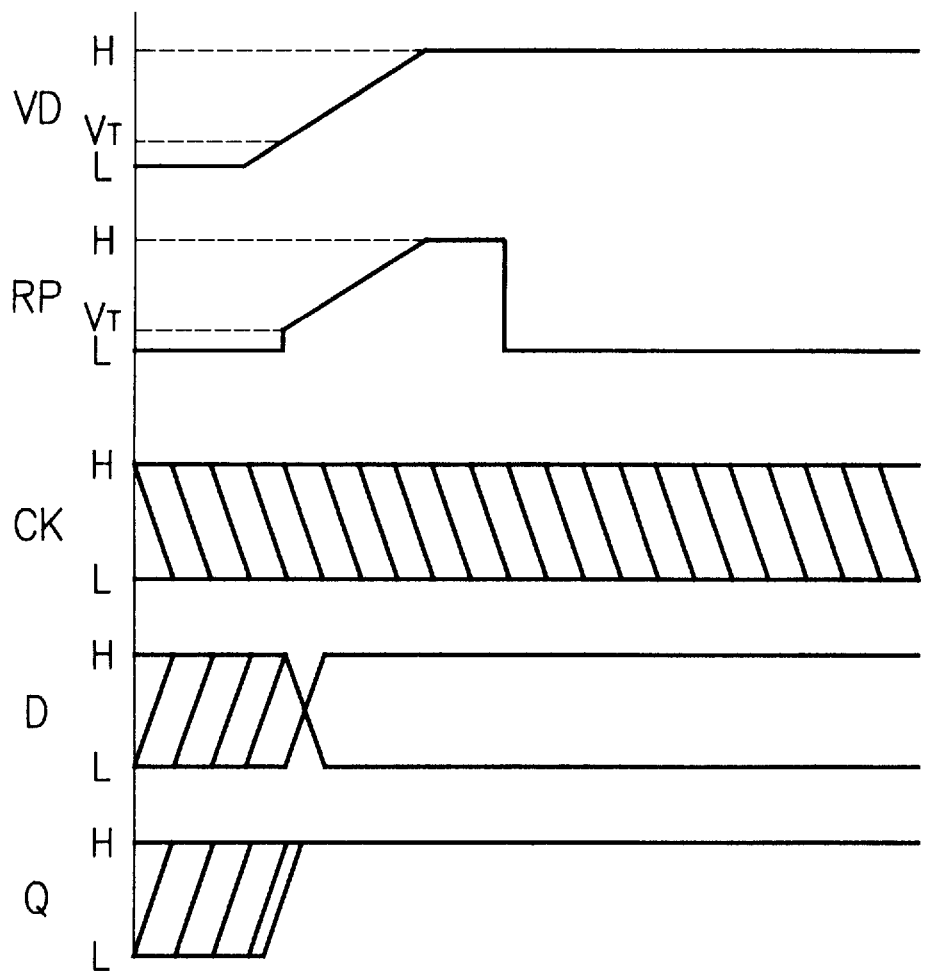
FIG. 4 is a time chart showing one example of operation in the conventional data latch circuit device.
Figure 5:
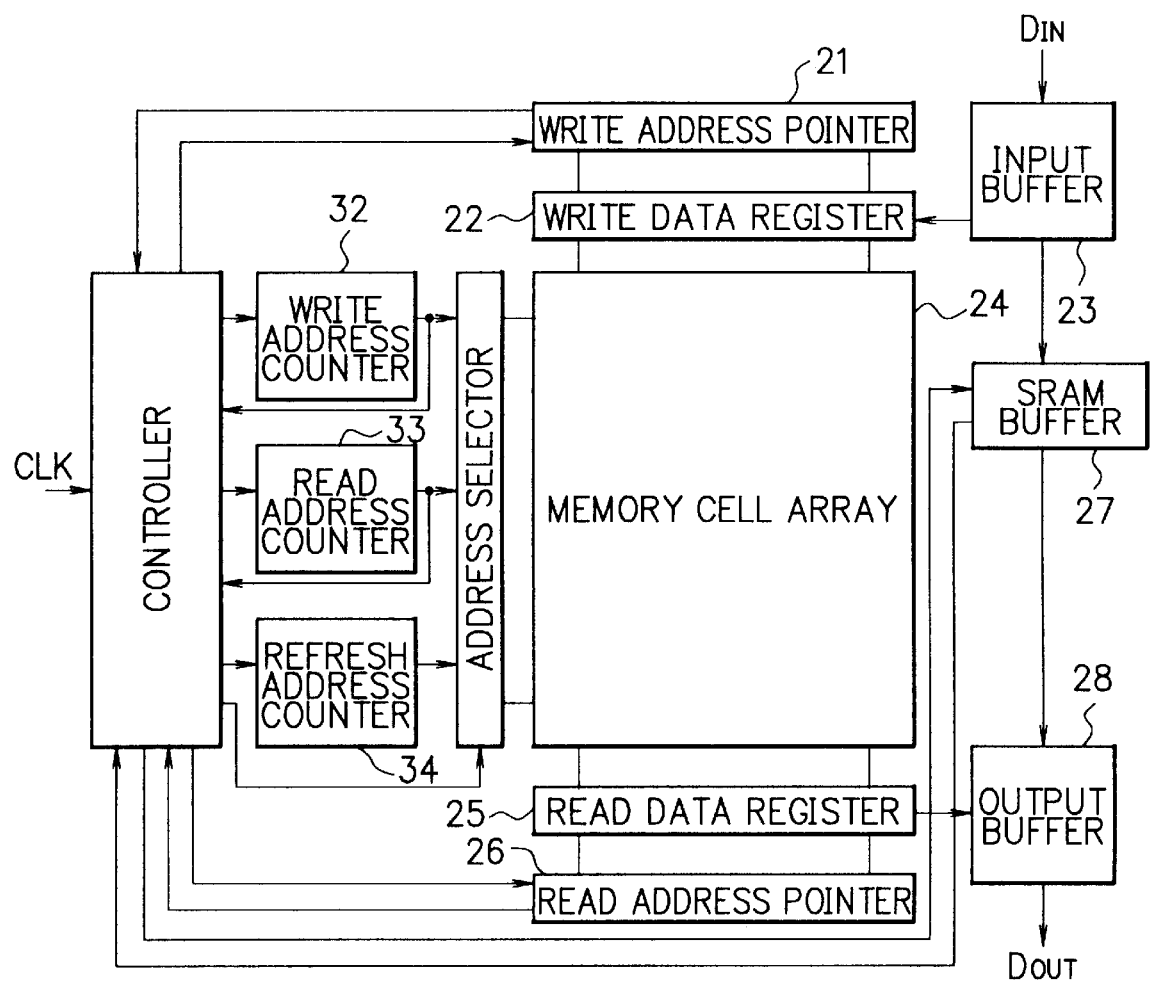
FIG. 5 is a block diagram showing one example of constitution of field memory.

FIG. 6 is a block diagram showing a first embodiment of a data latch circuit device according to the present invention. In FIG. 6, common reference characters/numerals are appended to common structural elements of prior art of FIG. 1. A data latch circuit device of the first embodiment shown in FIG. 6 comprises a power-ON-reset generation circuit 12 for outputting a reset signal RP which is common to conventional one, a back bias generation (BBG) circuit 14 for generating substrate voltage SB in answer to supply of a pulse signal PC, a ring oscillator circuit 13 for outputting a pulse signal PC, a DFF 11 with non reset function instead of DFF with reset function, an inverter I1 for generating an inversion reset signal RPB while inverting a reset signal RP, a transfer gate TG1 whose one end is connected to ring oscillator circuit 13, and whose another end is connected to clock input CK of the DFF 11, thus passing pulse signal PC therethrough in answer to supply of complementary reset signals RP, RPB, and a transfer gate TG2 whose one end is applied by supply of clock CLK, and whose another end is connected to the clock input CK of the DFF 11, thus passing signal CLK therethrough in answer to supply of complementary reset signals RPB, RP.

The transfer gate TG1 has the same constitution as that of TG2, for convenience' sake, there is explained with respect to the TG1 only. A P-channel transistor P1 and an N-channel transistor N1 are connected in parallel, thus causing respective sources connected to commonly to connect to the ring oscillator circuit 13, and causing respective drains connected to commonly to connect to the clock input CK of the DFF 11. The reset signal RP is applied to the gate of the transistor N1, and the inversion reset signal RPB is applied to the gate of the transistor P1. Further, in the transfer gate TG2, the inversion reset signal RPB is applied to the gate of the transistor N2, and the reset signal RP is applied to the gate of the transistor P2.

FIG. 7 is a circuit diagram showing a constitution of the DFF of FIG. 6. Referring to FIG. 7, the DFF 11 comprises inverters I11, I12 constituting the master FF to latch data, transfer gates TG11, TG12 controlled by clocks CK, CKB, inverters I13, I14 constituting the slave FF to latch data, transfer gates TG13, TG14 controlled by clocks CK, CKB, an inverter I15 for generating inversion clock signal CK bar (B) while inverting clock signal CK, and an inverter I16 for outputting inversion data output QB while inverting data output Q.

Figure 8:
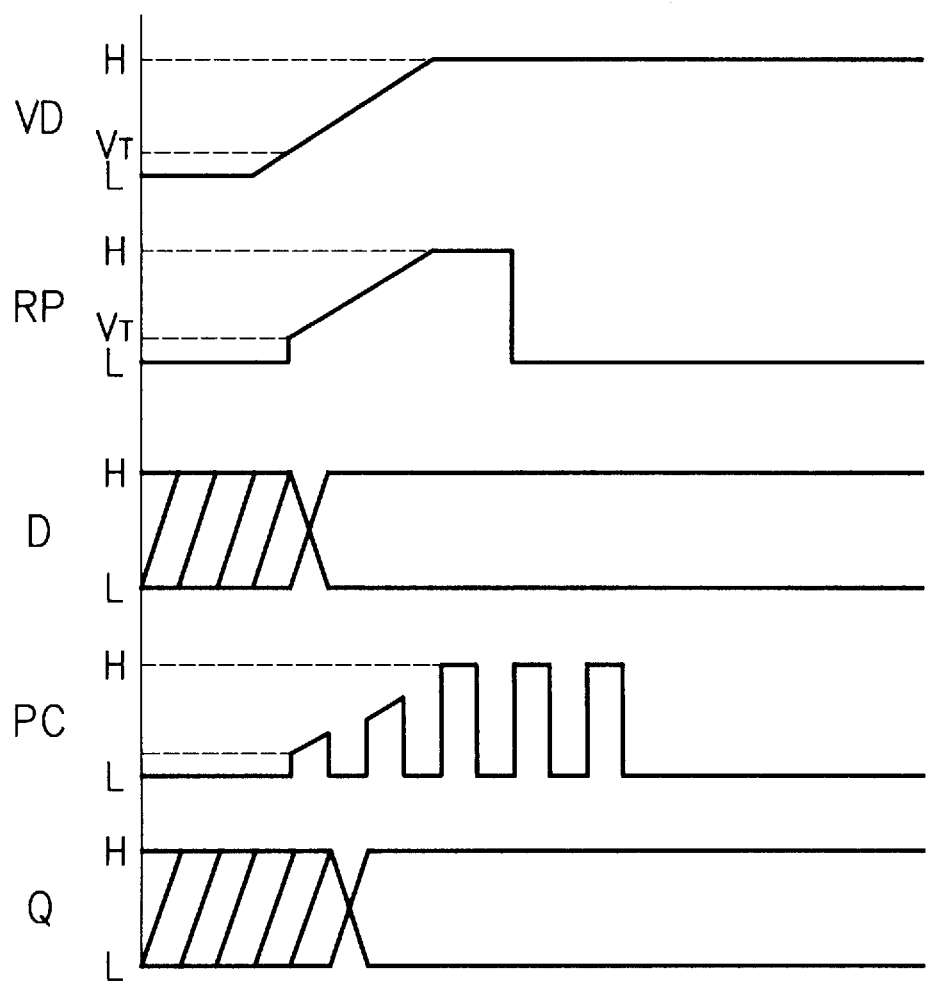
FIG. 8 is time chart showing one example of operation in the data latch circuit device according to the embodiment.

FIG. 8 is time chart showing one example of operation in the data latch circuit device according to the embodiment. Operation of the embodiment will be described referring to FIGS. 6, 7 and FIG. 8 which show operation waveform with time chart. When the power supply VD rises after putting the power supply to work, the power-ON-reset generation circuit 12 outputs a reset signal RP with H-level similar to conventional one. The inverter I1 supplies complementary reset signals RP, RPB to the transfer gates TG1, TG2 while generating inversion reset signal RPB. The transfer gate TG1 conducts current in answer to supply of the reset signals RP, RPB thus passing the pulse signal PC of the ring oscillator circuit 13 which pulse signal PC is rising with the power supply VD simultaneously to supply for the clock terminal CK of the DFF 11. On the other hand, the transfer gate TG2 comes to be cut-off state to obstruct the clock signal CLK. On a count of this operation, in the DFF, electric potential of respective gates is set to prescribed initial state due to the pulse signal PC.

Next, when prescribed time elapses, the reset signal RP is changed from H-level to L-level, it causes the transfer gate TG1 to switch to cut-off state, while it causes the transfer gate TG2 to switch to conductive state. Under this state, it causes the pulse signal PC to obstruct, and it causes the proper clock signal CLK to supply to the clock terminal CK of the DFF 11. After this, it turns to normal operation.

Above operation will be described in detail referring to FIG. 8 again. The power-ON-reset generation circuit 12 starts to output the reset signal RP with H-level, when the power supply VD rises so that voltage of the power supply VD rises more than threshold voltage Vt of transistor for voltage detection. At this time, since the data latch circuit device is to be stand-by state, the data input D is of fixed electric potential of either H-level or L-level. At this time point, the ring oscillator circuit 13 starts to output the pulse signal CP. Since the DFF circuit 11 is separated into two sides which are the master side and the slave side, value of the output Q is determined when the pulse signal CP, which is applied to the clock input, is H-level, next the pulse signal CP, which is applied to the clock input, is L-level.

With respect to the ring oscillator 13, when the power supply VD comes to be more than threshold voltage Vt of the transistor of the circuit, it starts to operate automatically, thereby it is unsettled whether the pulse signal CP inverts from H-level to L-level or the pulse signal CP inverts from L-level to H-level within period when the reset signal RP is of H-level. For this reason, it is necessary to set pulse width of the reset signal RP to cycle time more than two cycles of the pulse signal PC.

For example, when one cycle of the pulse signal PC is taken to be 2 μs, it causes H period of the reset signal is set to more than 4 μs.

In the stand-by state after putting the power supply to work, respective gates of the DFF circuit 11 is surely fixed to certain electric potential without floating thereby, feedthrough current disappears, it is capable of measuring accurate stand-by current. Further, since prescribed output state is set, it causes normal circuit operation to insure, it is capable of diminishing chip size.

Figure 9:
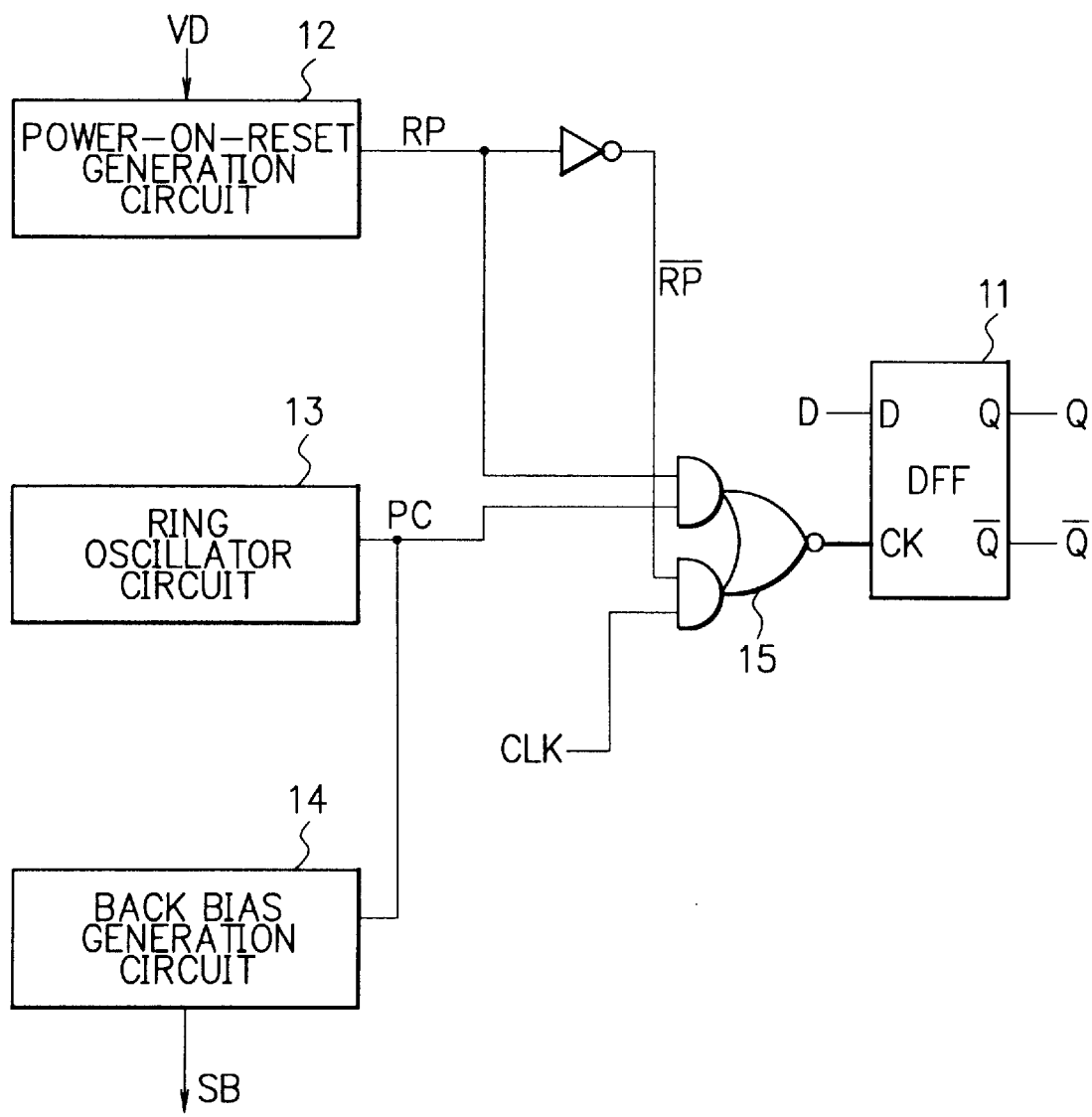
FIG. 9 is a block diagram showing a second embodiment of the data latch circuit device according to the present invention.

FIG. 9 is a block diagram showing a second embodiment of the data latch circuit device according to the present invention.

In FIG. 9, common reference characters/numerals are appended to common structural elements of FIG. 6. The second embodiment shown in FIG. 9 differs from the above described first embodiment in that there is provided AND-NOR circuit 15 instead of the transfer gates TG1, TG2.

The AND-NOR circuit 15 performs the same operation as that of the first embodiment due to the fact that it causes NOT-OR operation to operate to both of AND of the reset signal and the pulse signal, and AND of inversion reset signal RPB and clock CLK.

As described above, the data latch circuit device according to the present invention is provided therewith a switch means which causes the pulse signal of the ring oscillator to switch so as to apply the pulse signal to clock input end of the DFF circuit, which pulse signal is in use for BBG circuit instead of original clock signal within active period of the reset signal in answer to supply of the reset signal. The above pulse signal is utilized as a clock signal of the DFF circuit after putting the power supply to work, thereby, it causes the number of elements to reduce while replacing DFF circuit with reset function accompanied with a large number of elements into normal DFF circuit. There is the effect that it is capable of reducing chip size because it is not necessary to perform wiring of bus line for reset signal.

While preferred embodiments of the invention have been described using specific terms, such description is for illustrative purpose only, and it is to be understood that changes and variations may be made without departing from the spirit or scope of the following claims.

What is claimed is:

1. A data latch circuit device comprising:
   a power-ON-reset generating circuit for generating reset signal of one shot pulse at the time putting power supply to work;
   an oscillation circuit for outputting pulse shaped back bias driving signal for driving back bias generation circuit for generating substrate voltage;
   a D-flip-flop circuit for latching data signal while synchronizing said data signal with clock signal and for outputting prior latch data;
   a synchronous dynamic random access memory for transferring said data signal while synchronizing said data signal with said clock signal; and
   a switch means for switching so as to supply said back bias driving signal to clock input end of said D-flip-flop circuit instead of clock signal within active period of said reset signal in answer to supply of said reset signal.

2. A data latch circuit device as claimed in claim 1, wherein said switch means comprises a first transfer gate circuit for conducting said back bias driving signal in answer to a pair of complementary reset signals consisting of said reset signal and inversion reset signal which is of inverted signal of said reset signal, and a second transfer gate circuit for obstructing said clock signal in answer to said pair of complementary reset signals.

3. A data latch circuit device as claimed in claim 1, wherein said switch means comprises an AND-NOR circuit for supplying NOT-OR to clock input end of said D-flip-flop circuit, which NOT-OR consists of a first AND of said reset signal and said back bias driving signal, and a second AND of said inversion reset signal which is of inverted signal of said reset signal and said clock signal.

4. A method for latching data by a data latch circuit device comprising the steps of:

generating reset signal of one shot pulse at the time putting power supply to work;

outputting pulse shaped back bias driving signal for driving back bias generation circuit for generating substrate voltage;

latching data signal while synchronizing said data signal with clock signal and for outputting prior latch data;

transferring said data signal while synchronizing said data signal with said clock signal; and switching so as to supply said back bias driving signal to clock input end of a D-flip-flop circuit instead of clock signal within active period of said reset signal in answer to supply of said reset signal.

5. A method for latching data by a data latch circuit device as claimed in claim 4, wherein said method further comprises the steps of:

conducting said back bias driving signal in answer to a pair of complementary reset signals consisting of said reset signal and inversion reset signal which is of inverted signal of said reset signal; and obstructing said clock signal in answer to said pair of complementary reset signals.

6. A method for latching data by a data latch circuit device as claimed in claim 4, wherein said method further comprises the steps of:

supplying NOT-OR to clock input end of said D-flip-flop circuit, which NOT-OR consists of a first AND of said reset signal and said back bias driving signal, and a second AND of said inversion reset signal which is of inverted signal of said reset signal and said clock signal.

* * * * *